United States Patent
Gupta et al.

(10) Patent No.: US 7,581,059 B2
(45) Date of Patent: Aug. 25, 2009

(54) CONTROLLING A SEARCHABLE RANGE WITHIN A NETWORK SEARCH ENGINE

(75) Inventors: Pankaj Gupta, Palo Alto, CA (US);
Srinivasan Venkalachary, Sunnyvale, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 553 days.

(21) Appl. No.: 11/460,615

(22) Filed: Jul. 27, 2006

(65) Prior Publication Data

US 2007/0028039 A1 Feb. 1, 2007

Related U.S. Application Data

(60) Provisional application No. 60/702,950, filed on Jul. 27, 2005.

(51) Int. Cl.
*G06F 12/00* (2006.01)
(52) U.S. Cl. ..................... 711/108; 365/49.1
(58) Field of Classification Search .................. 711/108
See application file for complete search history.

(56) References Cited

U.S. PATENT DOCUMENTS

| | | | |
|---|---|---|---|
| 5,913,215 A * | 6/1999 | Rubinstein et al. | 707/10 |
| 6,934,796 B1 * | 8/2005 | Pereira et al. | 711/108 |
| 7,230,841 B1 * | 6/2007 | Srinivasan et al. | 365/49.15 |
| 2005/0138280 A1 * | 6/2005 | Kaginele | 711/108 |
| 2005/0262295 A1 * | 11/2005 | Nataraj et al. | 711/108 |
| 2005/0268028 A1 * | 12/2005 | Mukherjee | 711/108 |

* cited by examiner

*Primary Examiner*—Brian R Peugh
*Assistant Examiner*—Matthew Bradley
(74) *Attorney, Agent, or Firm*—Shemwell Mahamedi LLP; William L. Paradice

(57) ABSTRACT

Controlling a searchable range within a network search engine. A CAM array is provided within the network search engine to store data values in entries having respective addresses and to compare the data values with a search key. First address and a second addresses that define a range of the addresses are received at an interface of the network search engine, and range-control circuitry is provided within the network search engine to generate a hit signal having either a first state or a second state according to whether any of the entries having addresses within the range of addresses match the search key.

10 Claims, 11 Drawing Sheets

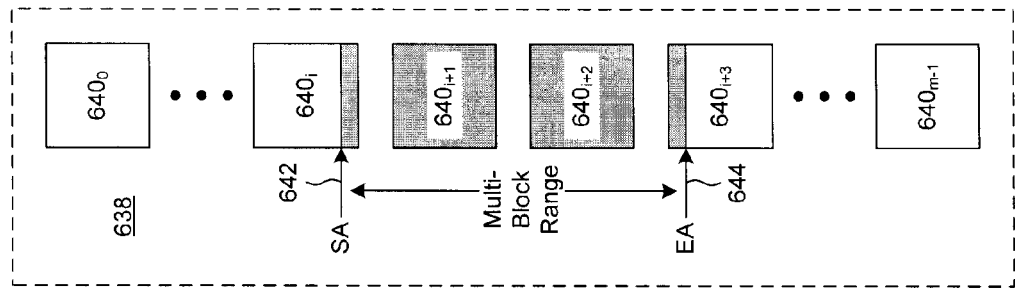
FIG. 6E
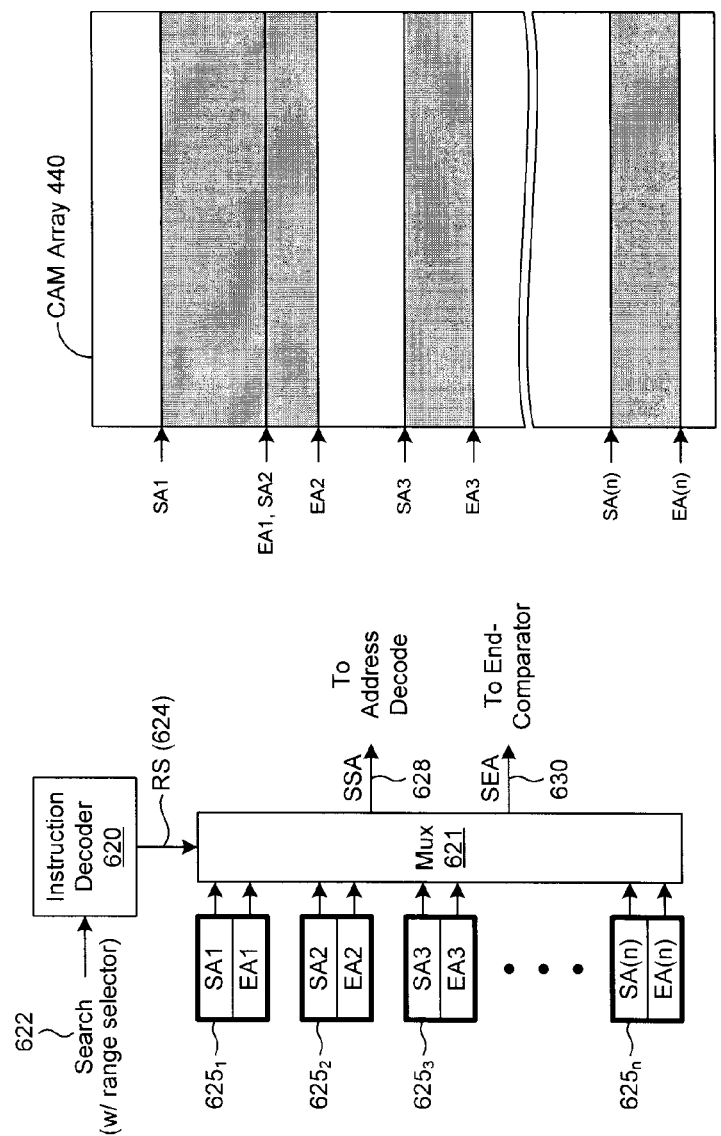
FIG. 6D
FIG. 6C

CONTROLLING A SEARCHABLE RANGE WITHIN A NETWORK SEARCH ENGINE

CROSS-REFERENCE TO RELATED APPLICATIONS

This application claims priority from, and hereby incorporates by reference, U.S. Provisional Application No. 60/702,950, filed Jul. 27, 2005 and entitled "Circuits and Methods for Controlling a Searchable Range Within Network Search Engines (NSEs)."

TECHNICAL FIELD

This invention relates to searchable database applications and, more particularly, to circuits and methods for controlling a searchable range within a memory device.

BACKGROUND

Network Search Engines (NSEs), including content addressable memory (CAM) devices, are often used in packet-switched networking applications to manage network traffic. An NSE can be instructed to compare a search value, typically formed from one or more fields within a packet header, with a database of values stored within an associative storage array or CAM array. If the search value matches a database entry, the NSE device generates a match address that identifies the location of the matching entry within the CAM array, and asserts a match flag to signal the match. The match address is then typically used to index another storage array, either within or separate from the NSE, to retrieve information that indicates additional operations to be performed with respect to the packet.

In many applications, it may be desirable to store multiple databases within an NSE and to selectively search the databases according to instructions from a control device such as a network processing unit (NPU) or the like. Accordingly, modern NSEs often include multiple, distinct CAM blocks (e.g., each CAM block having a respective CAM array and circuitry to generate a block match address and block flag signal based on match results generated within the corresponding CAM array) that may be allocated to storage of different databases. Unfortunately, allocating NSE storage on a CAM block by CAM block basis often results in substantial wasted storage as some databases require only a fractional portion of the CAM array entries within a CAM block (e.g., as when the database is small, or when the database required one or more whole CAM blocks and only a fractional portion of another). While table identifier bits or tag bits may be stored within the CAM array entries to designate specific entries as belonging to a particular database, storage of such bits undesirably reduces storage capacity.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6C illustrates circuitry that may be provided within a CAM device to establish pre-defined logical sub-divisions within one or more CAM arrays of the CAM;

FIG. 6D illustrates a CAM array that is logically partitioned into multiple address ranges;

FIG. 6E illustrates an exemplary manner in which address ranges may span multiple CAM blocks;

DETAILED DESCRIPTION

Network Search Engines (NSEs) having circuitry to enable fractional portions of CAM arrays to be allocated for storage of particular databases or for any other purpose are disclosed herein in various embodiments. In one embodiment, an interface is provided to receive a start address and end address that define a range of entries within a CAM array (or a range of entries that span multiple CAM arrays) that are enabled to yield a hit indication during a search operation. In a particular embodiment, for example, the start address is supplied to an address decoder which, in conjunction with match suppression logic, suppresses match indications from entries having lower-numbered addresses than the start address. The end address may similarly be supplied to logic that suppresses match indications from entries having higher-numbered addresses than the start address, so that a hit signal (or match flag) is asserted only if a match is signaled for an entry stored at an address within the range defined by the start and end addresses. Accordingly, by specifying start and end addresses that define a range of entries to be searched, a flexible, logical sub-division of the CAM array (or set of CAM arrays) may be achieved without requiring storage of table identifier bits, tag bits or other CAM-storage-consuming information. Match signal suppression may be achieved by discharging (or charging) match lines outside the specified search range, thereby preventing match indications to be signaled on those match lines, or by blocking match signals from reaching match address encoding circuitry (e.g., by logically ANDing match indications with match-mask values generated in response to the start and/or end addresses). Also, the end address may be compared with an eventual match address (e.g., generated by a priority encoder or similar circuit) with the comparison result used to suppress assertion of a hit signal if the match address is greater than the end address. Also, search ranges may be specified by supplying start and end addresses on a search-by-search basis (e.g., in conjunction with each search instruction), or may be specified by providing a selector value to select pre-defined start and end addresses (e.g., start and end addresses that have been loaded into registers or other storage in advance). Although the term "network" is specifically used throughout this disclosure, the term network is defined to include the Internet and other network systems, including public and private networks that use the Internet Protocol (IP) protocol suite for data transport. Examples include the Internet, Intranets, extranets, telephony networks ("using voice over IP"), and other wire-line and wireless networks that converge on the use of the IP family of protocols. Although the term "Internet" may be used throughout this disclosure, the term Internet is merely one example of an IP "network."

Figure 1:
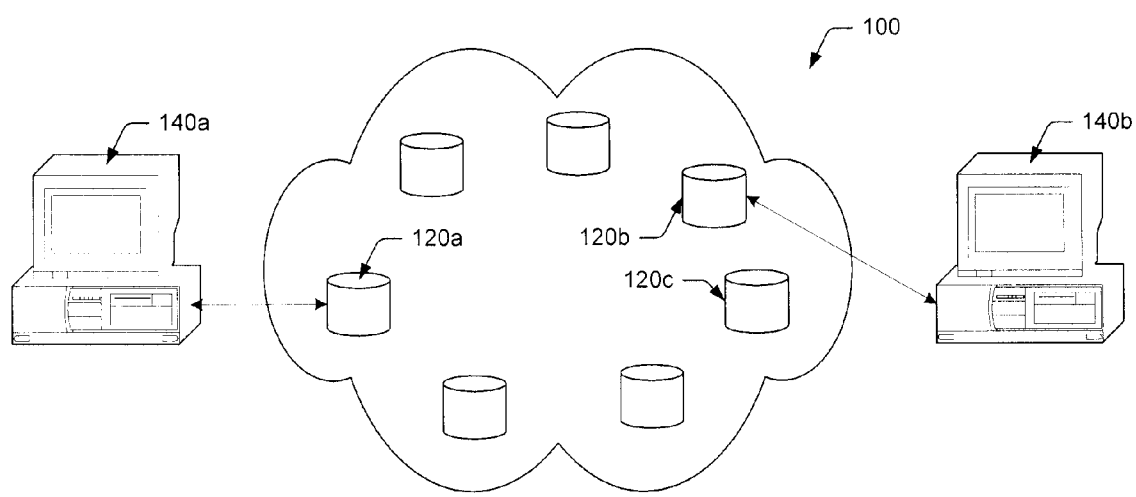
FIG. 1 is a block diagram of a communication network.

FIG. 1 illustrates possibly numerous forwarding devices 120 within a computer network 100. The topology of the Internet or the Intranet interposed between computers 140 can vary. If computer 140a wishes to send a packet of data to computer 140b, then it must do so by traversing one or more forwarding devices 120 within network 100. Forwarding device 120a might receive the packet, which includes a destination address of, for example, forwarding device 120b (or computer 140b). Determining where to send the packet within network 100 so that the packet arrives at a forwarding device (or hop) closer to the destination, is essentially the function of the routing table within the forwarding device 120a. Optimally, the routing table within forwarding device 120a will receive the destination address, and will compare that address (or "search key") to prefix entries stored within the routing table. Associated with each prefix entry might be a next hop identifier. Thus, once a prefix entry is found that matches (using, for example, the longest prefix match comparison) the destination address, the packet can be routed to the next hop to be one step closer to the intended destination.

Figure 2:
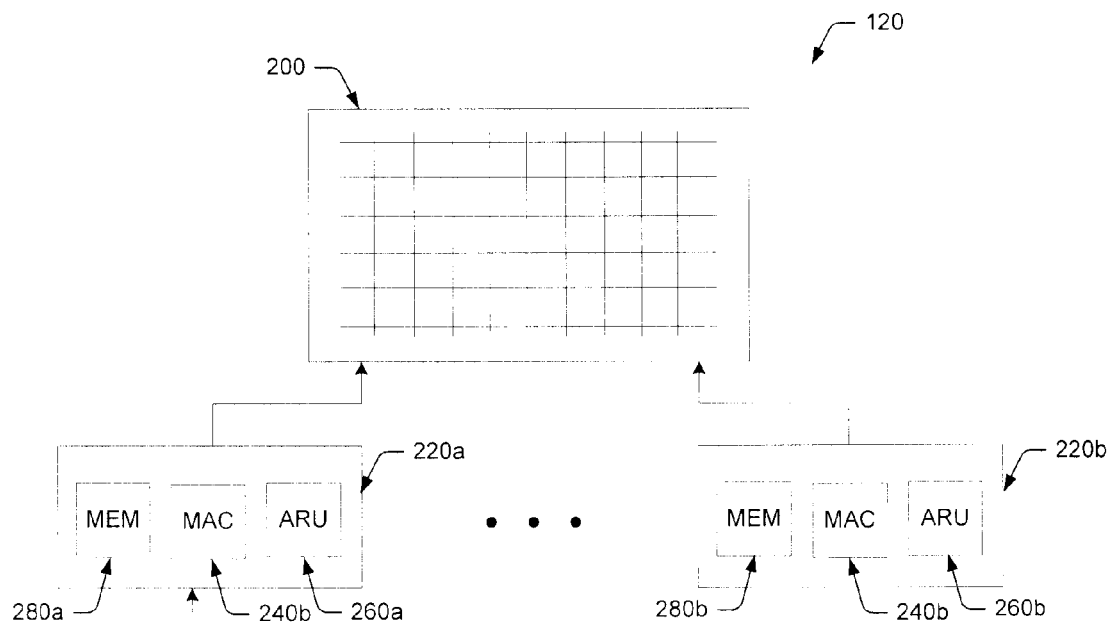
FIG. 2 is a block diagram of a packet-forwarding engine, or "forwarding device" within the communication network of FIG. 1.

FIG. 2 illustrates one example of forwarding device 120, such as a router, gateway, bridge, or switch. Forwarding device 120 is often called a "packet-forwarding engine" and may contain a switching fabric 200 and a plurality of line cards 220. Switching fabric 200 is generally well known, and may involve a crossbar switch that interconnects all the line cards with one another. At least one line card may contain a routing processor. Forwarding device 120 can, therefore, be thought of as performing two functions: (i) performing route lookup based on the destination address of the packet in order to identify an outgoing port; and (ii) switching the packet to the appropriate output port.

The routing function can be performed primarily on the incoming line card (e.g., line card 220a), whereas switching of the packet to the appropriate output port or line card can take place within switching fabric 200. The Destination Address (DA) of the packet can enter line card 220a via an I/O interface. Each line card typically includes a Media Access Controller (MAC) 240, an Address Resolution Unit (ARU) 260, and a memory device 280. MAC 240 can be configured to accept many different communication protocols, such as, e.g., the Carrier Sense Multiple Access/Collision Detect (CSMA/CD), Fiber Distributed Data Interface (FDDI), or Asynchronous Transfer Mode (ATM) communication protocols. As packets are read from ingress MAC 240a, forwarding control information necessary for steering the packet through switching fabric 200 will be pre-appended and/or appended to those packets.

In some cases, the ARU 260 at the ingress line card may perform the routing function using the longest prefix match comparison technique. The ARU can perform classless or class-based routing functions and can support Variable Length Subnet Masks (VLSM). Each ARU can be reconfigured—as routes are added or deleted from the network—using well-known routing protocols, such as RIP, OSPF, or BGP. The memory device 280 can be implemented in various types of Random Access Memory (RAM), such as DRAM, SRAM, or Content-Addressable Memory (CAM), a popular form of masking CAM being Ternary CAM (or TCAM). Memory 280 may contain various lookup tables, such as a pointer table, a routing table and/or a next hop table. If one or more of the lookup tables are copied and placed within the line card 220, lookups on incoming packets can be performed locally, without loading the central processor of forwarding device 120.

In some cases, additional lookup tables may be included to make the overall routing algorithm "flow-aware." Instead of routing individual packets of data using a best-effort service, for example, the packets can be classified into specific flows. Routers or switches that are flow-aware may be used to classify incoming packets according to differentiated services. All packets belonging to the same flow may be treated in a similar manner.

A collection of rules or policies can be defined to determine whether a packet belongs to a specific flow before the packet is sent to its next hop. The rules or policies define an action to be applied to the packet, such as denying or allowing access to a protected network. Rules or policies that specify a particular flow are often based on the source address, destination address, and other designators within the incoming packet. For example, a packet filtering technique may use a rule or policy for denying all traffic from a particular Internet service provider (ISP) destined to a particular address. In addition to packet filtering, various rules may be employed to provide policy routing, rate-limiting, and traffic shaping abilities. Some or all of these rules may be defined within another lookup table—referred to as an access control list (ACL)—stored in a database.

The above-mentioned tables can be maintained in separate memory devices or in different portions of the same memory device. For example, one memory device may be used by a router for storing an ACL table, while another memory device may be used by the router to match the destination address of an incoming packet to one or more entries contained within a routing or forwarding table. However, the same memory device may be used, in other examples, for storing and searching through one or more different types of tables.

In some applications, it may be desirable to extract one or more matching entries from one or more tables stored within a given memory device. For example, one may wish to extract all of the routing table entries matching a particular destination address. In another example, a load balancing switch may direct packets to the servers experiencing the least load by first extracting all ACL table entries matching a particular rule set, and then using a different metric for directing a packet to a particular server. In other applications, only one matching entry may be desired, such as the entry having the highest priority.

Figure 3:
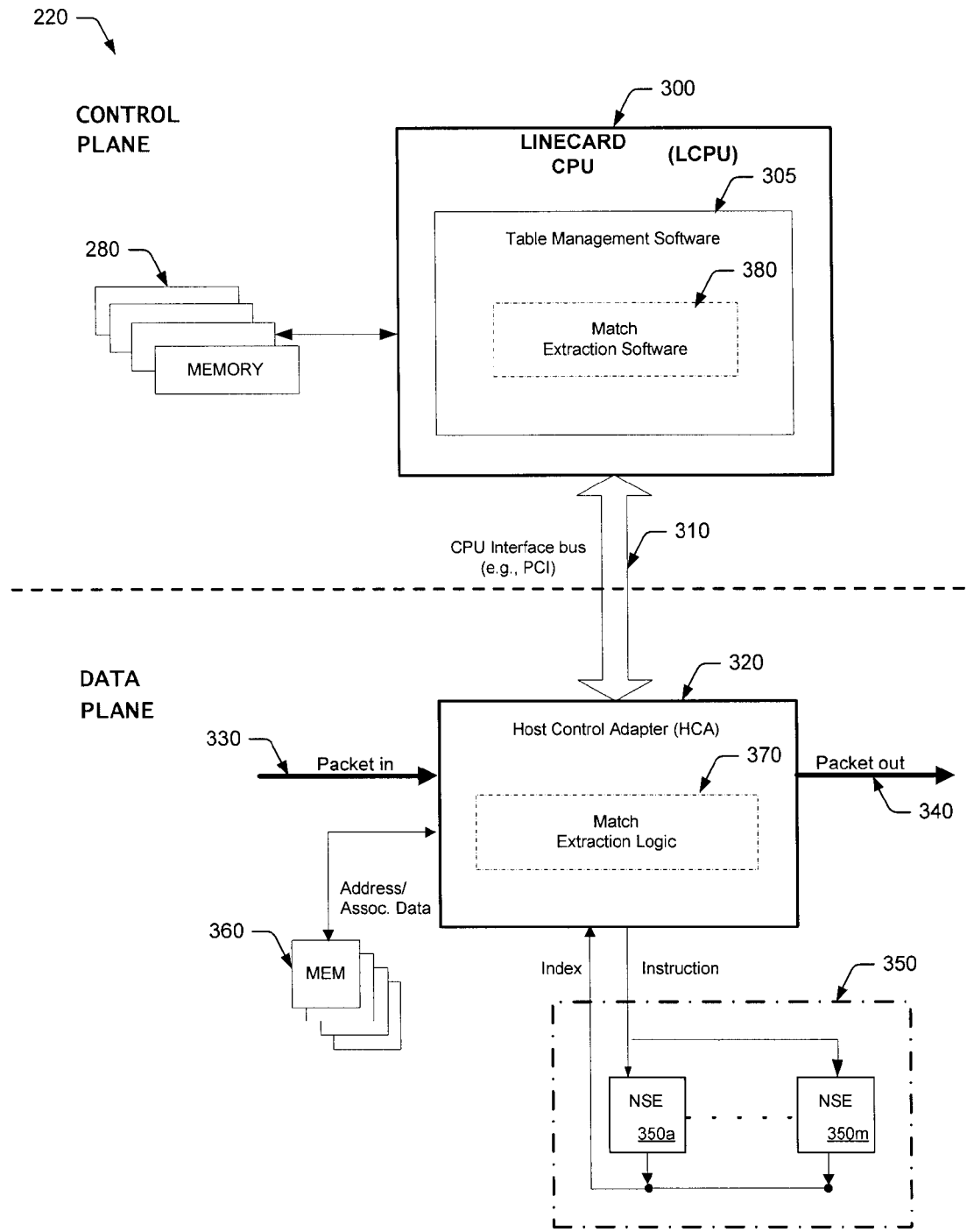
FIG. 3 is a block diagram of various software and hardware components that may be found within one or more line cards of the forwarding device of FIG. 2, including a Network Search Engine (NSE) comprising one or more Content Addressable Memory (CAM) devices.

FIG. 3 illustrates various hardware and software components that may be included within one or more line cards 220 of forwarding device 120 (FIGS. 1 and 2). As will be described in more detail below, line card 220 may include one or more memory devices, each of which may be used for storing one or more lookup tables. Exemplary lookup tables may include, but are not limited to, routing tables, pointer tables, next hop tables and ACL tables (which may include, e.g., filtering tables, Quality of Service tables, etc.). To overcome the problems encountered in conventional search operations (e.g., slow search speeds, large area consumption), line card 220 may include an improved means for locating and extracting matching entries from one or more of the lookup tables stored therein. Such means may be included within one or more line card processing devices, or within the memory devices themselves.

As shown in FIG. 3, line card 220 may contain a Network Search Engine ("NSE") 350 in the data plane of the line card with supporting components in the control plane of the line card. In some cases, a central processor 300 (referred to as a line card CPU, or "LCPU") may be included within the control plane of line card 220 for managing the hardware components of the line card. For example, LCPU 300 may be configured for running table management software 305. In general, software 305 may be used to compute and maintain the lookup tables stored within memory 280 and NSE 350. Though control plane memory 280 may include substantially any type of memory device, a static or dynamic RAM device may be preferred in most embodiments of the invention. The control plane memory 280 may be used for storing table management software 305, along with various lookup tables, including ACL tables, pointer tables, routing tables and next hop tables. The LCPU may communicate with the data plane components via interface bus 310.

Though a central processor (i.e., LCPU 300) is used herein for managing the forwarding database of a line card, such function should not be limited to a central processor in all embodiments of the invention. Other programmable units, such as, e.g., network processing units ("NPU"), custom designed Application Specific Integrated Circuits ("ASIC") or Field Programmable Gate Arrays ("FPGA") could replace LCPU 300 in alternative embodiments of the invention.

As shown in FIG. 3, a Host Control Adapter (HCA) 320 may be included within the data plane of line card 220 for handling and processing the data packets arriving at input port 330. HCA 320 could be, e.g., a custom-designed ASIC or a packet processor. The HCA is generally responsible for parsing the incoming data packets, extracting the destination address (or another search key), and performing the lookup in the forwarding tables stored within NSE 350. Though LCPU 300 and HCA 320 are both shown in the embodiment of FIG. 3, alternative embodiments of the invention may include only one processing device (e.g., LCPU 300 or HCA 320).

In some embodiments, NSE 350 may include an array of NSE modules (350a . . . 350m), in addition to the search engine software (not shown) that runs on the LCPU and manages the NSE array. The NSE array may be implemented in a variety of configurations, such as one search engine subsystem (i.e., one NSE array) on each line card in a distributed architecture, or one search engine subsystem on a centralized card. In a distributed architecture, control plane processing may be required for computing the forwarding table from the routing table. The control plane processing can be carried out independently on each line card, or on one centralized card.

As used here, the term "Network Search Engine" or "NSE" may refer to any device capable of: (i) storing a database of entries, (ii) using a search key to search for a particular entry within the database of entries and, as a result of the search, (iii) returning one or more indices of matching entries (i.e., entries that have at least one bit in common with the search key). The entries stored within the database can include, but are not limited to, "exact match entries" (e.g., complete IP destination addresses), "prefix entries" (e.g., one or more most significant bits of the IP destination address followed by a masked entry), and "lopped-off" prefix entries (e.g., prefix entries with one or more of their most significant bits replaced by a masked entry).

To perform a search or lookup operation, NSE 350 may carry out a simple request-response transaction, usually once every clock cycle. To initiate a "search request," a read instruction may be sent from LCPU 300 for locating an entry within the forwarding table of the NSE array that matches a particular search key. The "search response" is the index returned by the NSE array indicating the best matching route corresponding to that search key. The HCA may use the index to lookup (or locate) the attached memory device 360 (e.g., SRAM or DRAM) containing the data associated with the best matching route(s). The HCA may then use the associated data to perform other packet processing functions before sending the packet to an appropriate output port 340, which may be specified by the associated data.

To facilitate fast lookup operations, one or more Content Addressable Memory (CAM) devices (not shown) may be included within NSE 350 for storing the forwarding table entries and possibly other types of table entries. Exemplary CAM devices may include binary, ternary, or pseudo-ternary CAMs. Binary CAMs are generally configured for storing binary entries or entries that contain only 0 or 1 values. However, ternary CAMs (TCAMs) may be preferred over binary CAMs, in some embodiments, if enhanced flexibility is desired for storing or searching through the database of entries. This is because TCAMs store ternary entries, or entries that contain 0, 1 and x (i.e., "don't care") values. In some embodiments, a pseudo-ternary CAM may be used for storing a group of entries with a shared mask.

In some cases, a processing device may issue a search request for locating one or more entries matching a single search key. For example, LCPU 300 may issue a search request for locating and extracting a plurality of table entries matching a particular destination address. As such, match extraction logic 370 and software 380 may be included within the processing device (or within another processing device), in some embodiments of the invention, so that the plurality of matching entries may be identified within the table. In some cases, multi-match extraction may be performed as described in commonly assigned U.S. patent application Ser. No. 10/866,353, which is entitled "A CIRCUIT, APPARATUS AND METHOD FOR EXTRACTING MULTIPLE MATCHING ENTRIES FROM A CONTENT ADDRESSABLE MEMORY (CAM) DEVICE" and incorporated herein in its entirety. However, the inventive concepts described herein are not limited to only those search operations involving multiple matching entries. Rather, and as described in more detail below, the various circuits and methods described herein for controlling a searchable range may be applied to substantially any Network Search Engine (NSE) configured for locating and extracting one or more matching entries with a given search key.

In conventional search operations, a search key is provided to a Network Search Engine (NSE) for locating and extracting one or more table entries stored within a memory device of the NSE. In most cases, a Content Addressable Memory (CAM) device is used within the NSE for storing one or more tables, or a portion thereof. Though substantially any type of CAM may be included within the NSE, a Ternary CAM (TCAM) may be preferred over other CAM devices, due to the enhanced flexibility provided by ternary entries. To perform the search operation, all TCAM entries are searched in parallel, from beginning to end, and match lines are asserted when memory content matching at least a portion of the search key is found. If multiple matching entries are found, the matching entries are sent to a priority encoder to determine the address of the matching CAM entry with the highest-priority. In some cases, the matching entry with the highest-priority may be the "longest-matching prefix entry," or the CAM entry containing the greatest number of most significant bits matching the search key. In other cases, the matching entry with the highest-priority may be the matching entry stored at the lowest physical address.

Conventional search operations fail to provide an efficient search solution by searching the entire memory array (from beginning to end) and prioritizing all matching entries to produce a search result. In some cases, however, it may not be necessary to search the entire memory array or to prioritize all matching entries. For example, a requested content value may be known to reside within a particular range of memory locations. This may eliminate the need to search for and/or prioritize any matching or partially matching entries found outside of this range. Conventional search operations consume too much time and power by failing to narrow the search space and/or the search results, thereby hindering the performance of the TCAM search operation.

Figure 4A:
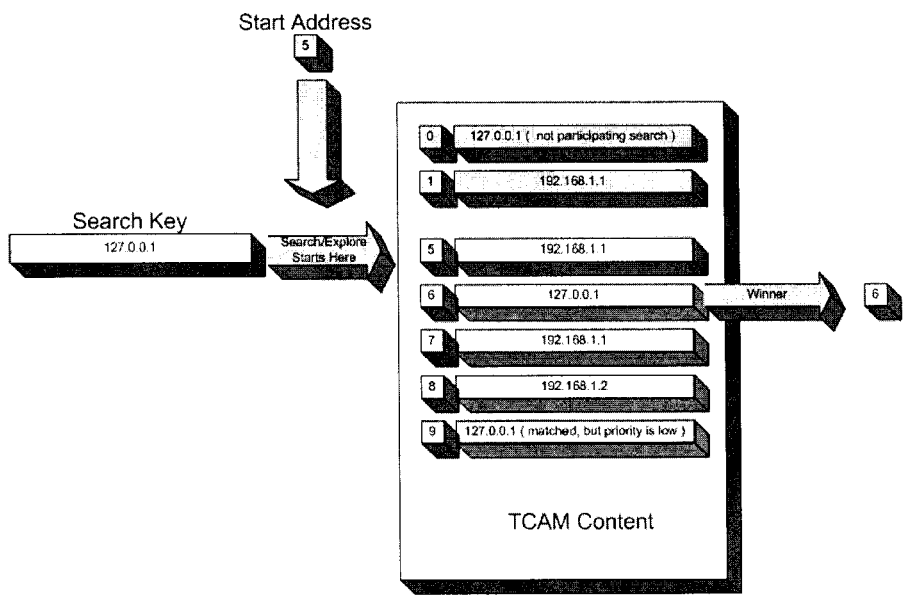
FIG. 4A is a simplified block diagram illustrating an exemplary manner in which at least one matching entry may be identified within a CAM device using range control circuitry, in accordance with one embodiment of the invention.

FIG. 4A is a block diagram illustrating the general concepts of an improved method for controlling a searchable range within a memory device, such as a TCAM. In some cases, the method may begin by supplying a search key (e.g., 127.0.0.1) to a TCAM device containing multiple table entries. However, instead of searching the entire memory array and prioritizing all matching entries, the current method implements a range control mechanism for limiting the memory partition, which can participate in the search and/or priority encoding operations. For example, instead of beginning the search at the first memory location (e.g., address 0), the current method may supply a start address to the range control mechanism to indicate a participating portion of the memory array. In FIG. 4A, a start address SA=5 (i.e., logical row address 5) indicates that only those entries stored within address 5 or greater will be allowed to participate in the search and/or priority encoding operations. After receiving the search key and start address, the method may return the matching entry with the highest priority as a search result (or "winner"). In the example of FIG. 4A, the matching entry stored at address 6 is determined to have the highest priority, because the matching entry has the lowest physical address within the specified range. However, only the entries within the designated portion of the memory array will be considered. All other matching entries (e.g., the matching entry located at address 0) will be disqualified for the search and/or priority encoding operations.

Figure 4B:
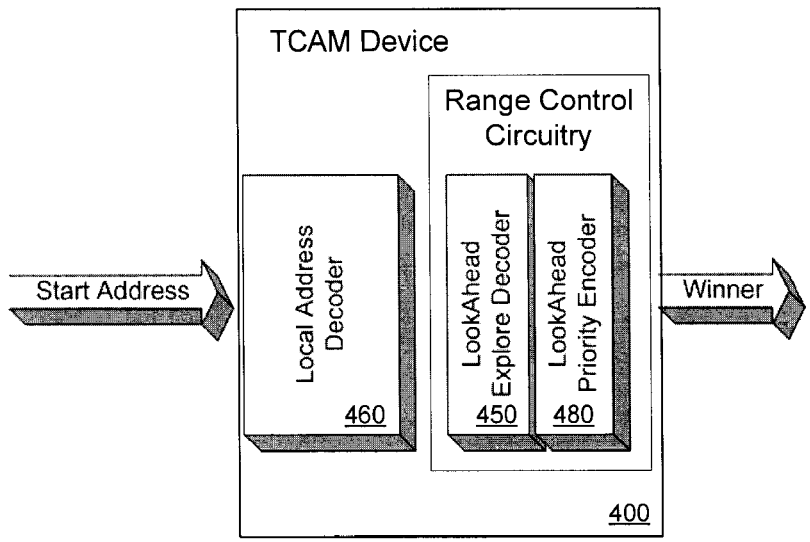
FIG. 4B is a simplified block diagram illustrating various components of the range control circuitry, in accordance with one embodiment of the invention.

FIG. 4B is a simplified block diagram illustrating one manner in which range control circuitry may be incorporated within a memory device, such as TCAM device 400. As shown in FIG. 4B, range control circuitry may generally include look-ahead explore decoder 450 and look-ahead priority encoder 480. When given a starting address for a TCAM block, the explore decoder 450 may qualify only the memory address locations (or matching entries), which fall within a valid range of memory locations between the starting address and an ending address (not shown). In some cases, the explore decoder 450 may qualify all memory locations or matching entries, which are greater than or equal to the starting address (e.g., SA=5, as shown in FIG. 4A). This embodiment assumes that the ending address will be the last logical block address in the memory array. In other cases, an ending address may also be supplied to the explore decoder 450 for validating a particular memory partition between a start address (SA) and an end address (EA), where SA and EA do not necessarily include the first and last logical block addresses of the memory array.

Figure 5A:
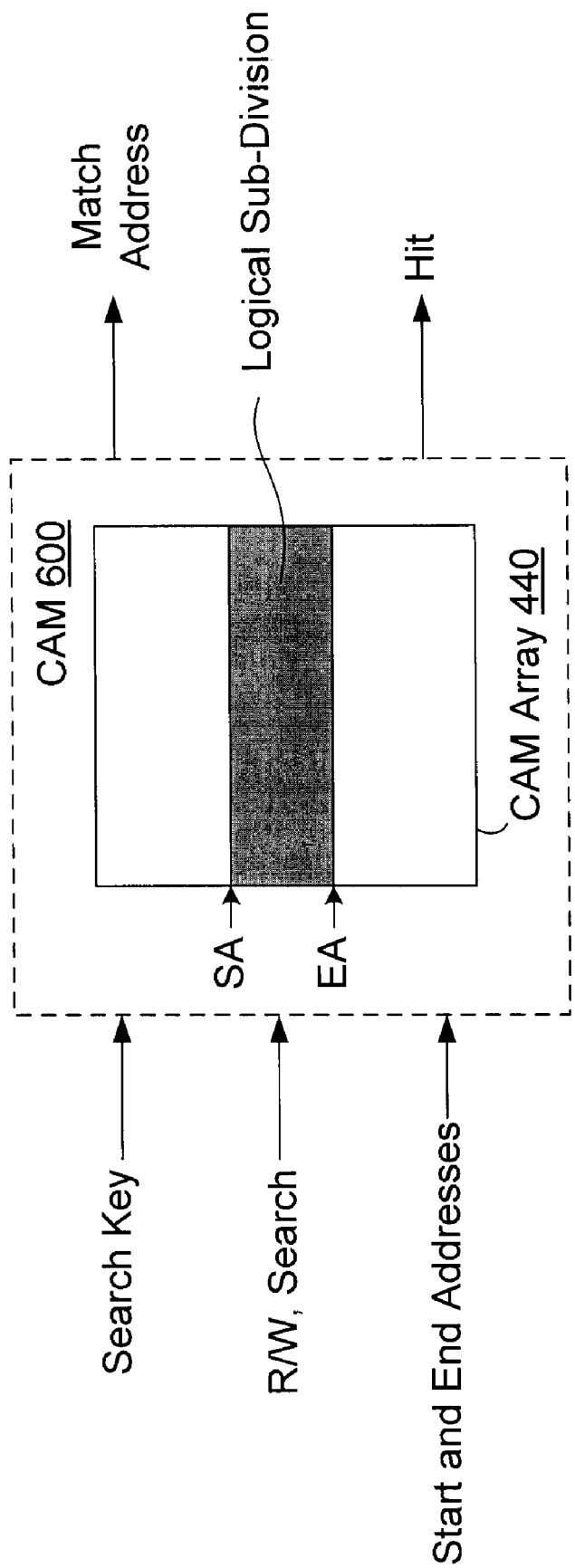
FIG. 5A illustrates an embodiment of a CAM device that applies a start address and an end address to define a logical sub-division within a CAM array.
Figure 5B:
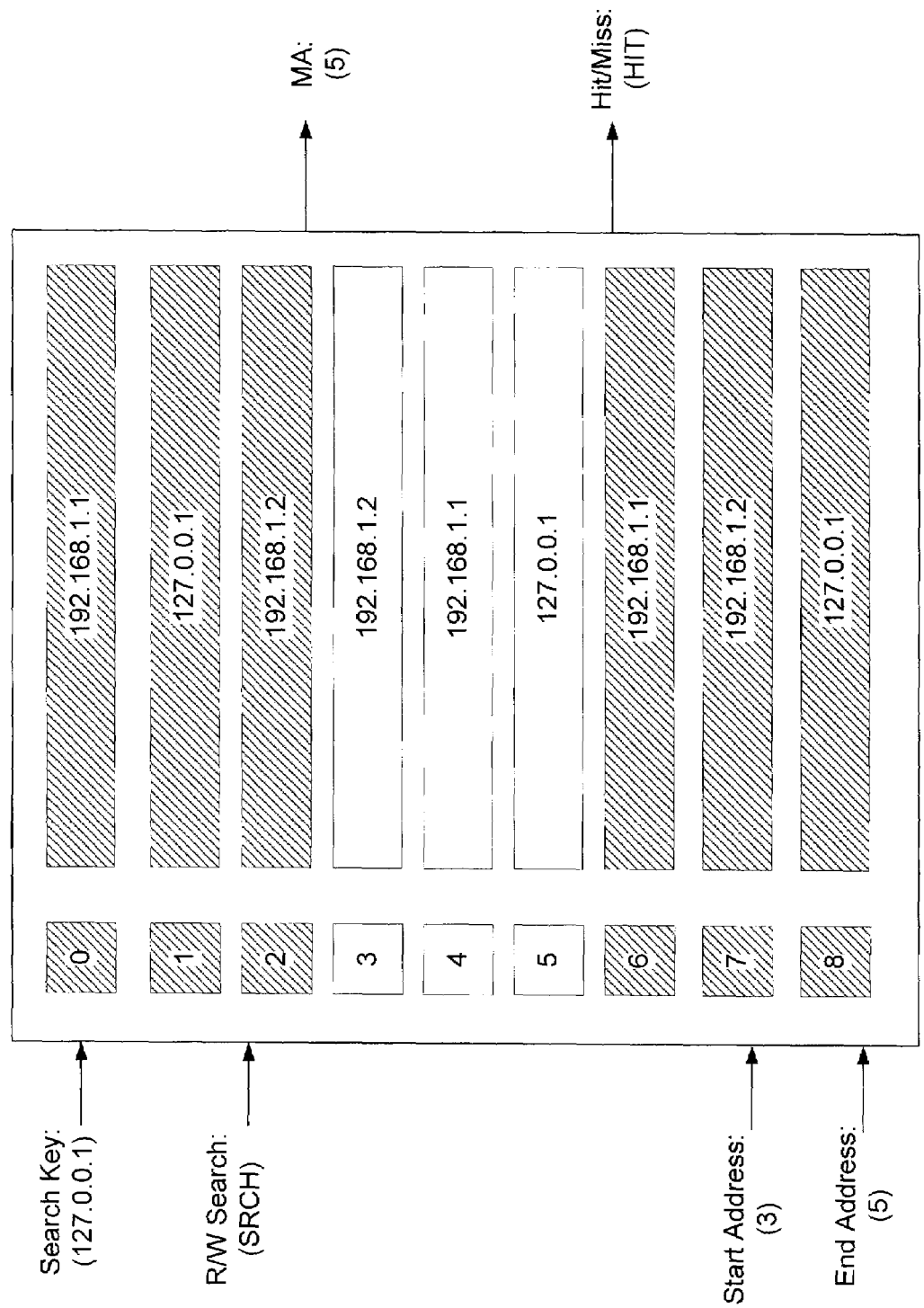
FIG. 5B illustrates an exemplary manner in which at least one matching entry may be identified within a CAM device using range control circuitry, in accordance with an alternative embodiment of the invention.

FIG. 5B is a block diagram illustrating a search within a range defined by a start address (SA) and an end address (EA), where SA and EA may be any address within the CAM array. Here, a search key (e.g. 127.0.0.1) is provided to the TCAM 500, along with a start address (SA=3) and an end address (EA=5). The start and end addresses define a searchable range from address 3 to 5, by disqualifying (e.g. preventing, suppressing, masking, etc.) all match indications that result from addresses 0 to 2 and 6 to 8, inclusive. For example, although there are data values stored at addresses 1 and 8 that match the search key (127.0.0.1), the TCAM will not assert a hit signal in response to the entries at either of these addresses. This operation is further illustrated in FIG. 5C, in which the searchable range is defined between SA=2 and EA=4. In this case, none of the data values stored between addresses 2 and 4, inclusive, match the search key, and thus the TCAM 500 outputs a miss signal (i.e., deasserts the hit signal). The match address associated with a miss signal may be any arbitrary value, depending on the algorithm used by the TCAM 500 for finding a highest priority match.

Figure 5C:
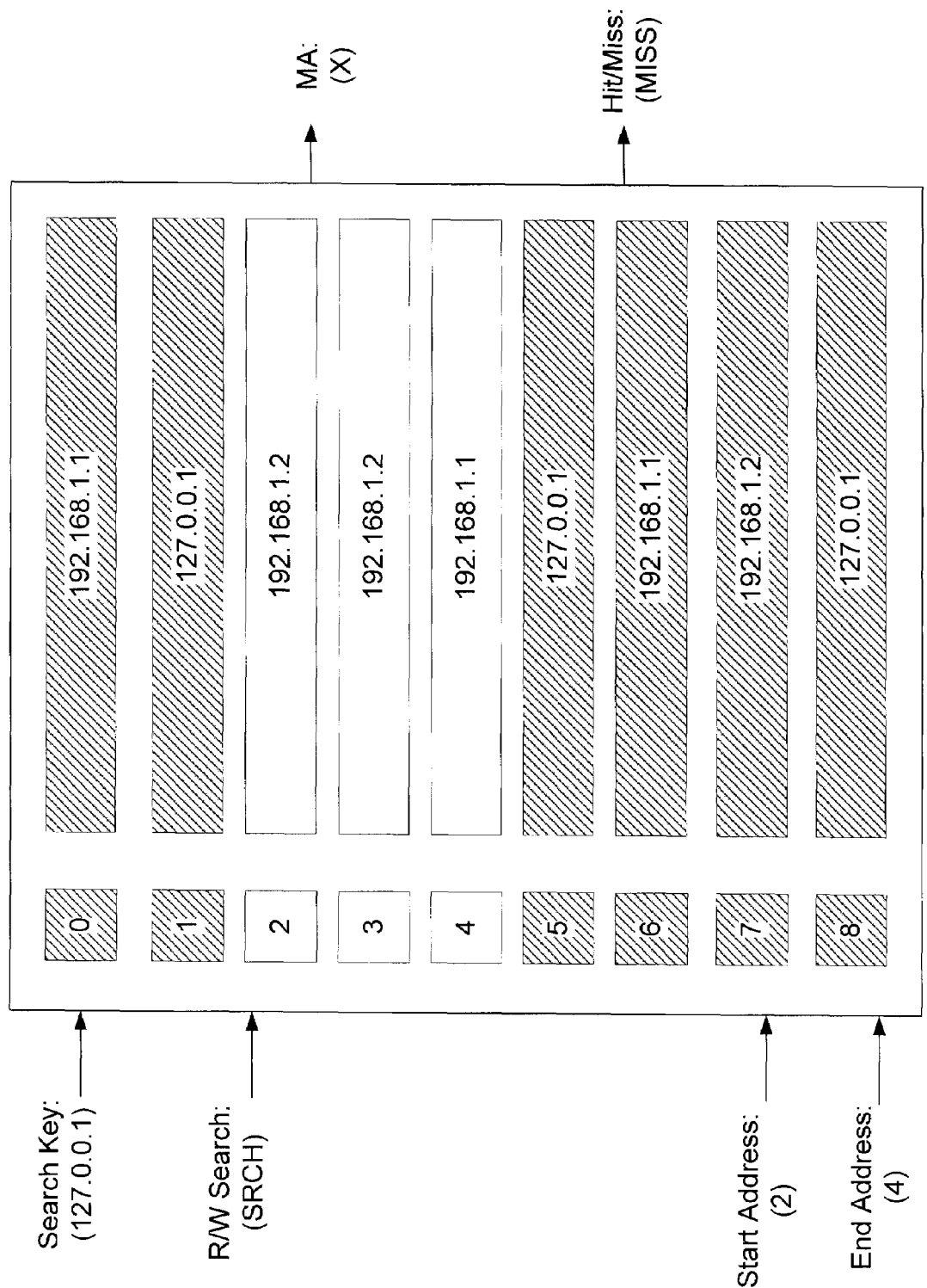
FIG. 5C illustrates another exemplary manner in which at least one matching entry may be identified within a CAM device using range control circuitry, in accordance with one embodiment of the invention.

Although FIGS. 5B and 5C show a searchable range between a start and end address, inclusive, it is also possible to define a range so as to exclude either the start and/or the end address from the searchable range.

Reflecting on the searchable range established by the start and end addresses, it can be seen that a flexible, logical subdivision of the CAM array is defined. That is, even within an otherwise unified CAM array in which a given search key is compared concurrently with all array entries (i.e., via a common or cascaded set of compare lines that convey the search key to each row of CAM cells within the CAM array), logical sub-divisions may be effected through start/end address definition and without need to store tag bits, table identifier bits or other sub-division identifiers within the CAM array itself.

Speed performance may be enhanced by using "look-ahead" circuitry for the search (i.e., explore) and prioritizing functions. In some embodiments, the explore decoder and priority encoder circuitry can be merged to allow tighter physical design topology, resulting in a pitched cell layout design. In some embodiments, the start address (and possibly, the end address) may be decoded using an existing local address decoder in address decode 460 (e.g., an existing wordline decoder) within the TCAM device. In this manner, the range control circuitry described herein can be incorporated within a TCAM device with little (to no) layout changes, therefore, minimizing the impact on chip area and design time.

Figure 6A:
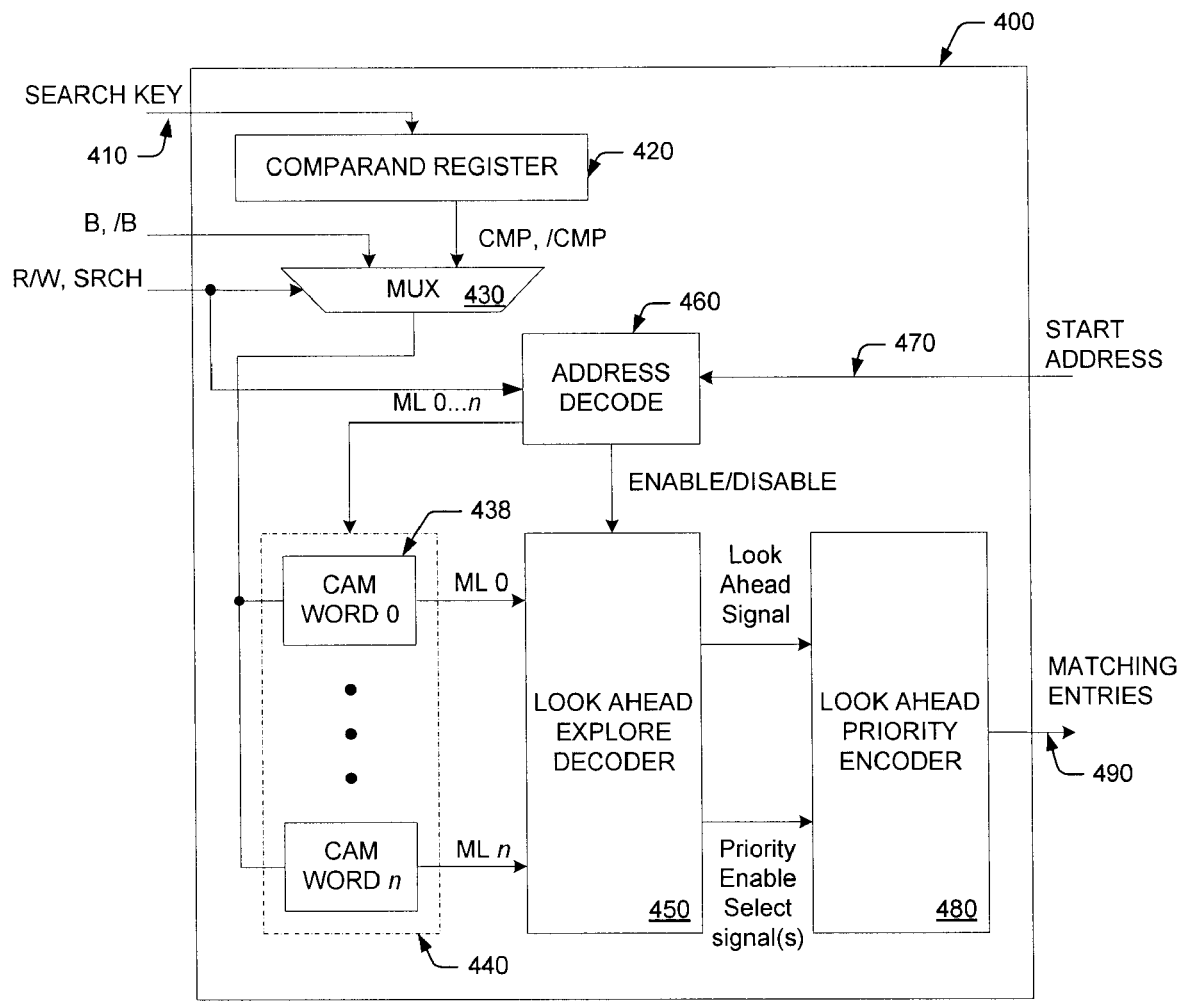
FIG. 6A is a functional block diagram illustrating an exemplary manner in which the range control circuitry of FIG. 4B may be used for prioritizing only a portion of the matching entries returned from a CAM device.

FIG. 6A illustrates one embodiment of CAM device 400. In general, CAM device 400 is configured for receiving data to be: i) written into storage cells, ii) read from the storage cells, or iii) compared with pre-existing data stored within storage cells. In particular, CAM device 400 is based on memory cells that have been modified by the addition of extra transistors, which compare the state of the bits stored in the memory cells with the data temporarily stored in comparand register 420. During a write or read operation, each memory cell within CAM device 400 acts like a normal SRAM cell, with differential bit lines (B and /B) used to latch the value into the cell during a write operation, and sense amplifiers to detect the stored value during a read operation. During a compare operation, differential compare lines (CMP and /CMP) are used in lieu of the differential bit lines.

A number of the memory cells may be grouped to form each of the CAM words 438 shown in FIG. 6A. The number of memory cells included within each CAM word may vary, and typically range between about 72 and 576 memory cells per word. In some cases, a database of entries may be stored within CAM device 400 in a random order, for example, by storing each new entry within the next available CAM word 438. In other cases, however, a specific order may be adhered to when storing the database entries. In the context of routing tables, the database entries having the longest prefix (e.g., the greatest number of bits in the network field) may be stored in the lowest numerical addresses of the CAM. In ACL tables, however, the database entries may be stored in a specific order imposed by an external entity (e.g., an order specified by a particular protocol, or by a network administrator). As described in more detail below, the type of table being searched may play a significant role in determining the starting address of a search operation.

As shown in FIG. 6A, a multiplexer 430 may be used to forward the differential bit lines or the differential compare lines into each of the CAM memory cells, depending on the particular operation to be performed. For example, multiplexer 430 may be used to enable the differential bit lines during a read or write operation, or to enable the differential compare lines during a search (or compare) operation. The multiplexer performs its selection similar to an encoder, which encodes whether the operation is a read, write or compare operation. In some embodiments, multiplexer 430 may actually comprise a group of multiplexers, one for every bit stored in the comparand register. The differential bit lines and differential compare lines may also be duplicated in a similar manner. For example, if comparand register 420 can store up to 48 bits, then there might be 48 multiplexers and 48 differential conductors for each of the CAM words 438 within CAM device 400. If there are n number of CAM words, and m number of multiplexers, CAM device 400 is said to be m bits wide and n words deep.

If every bit within comparand register 420 matches every bit within one or more CAM words 438, a match flag will be asserted upon a corresponding match line (ML0-MLn). An asserted match line indicates that the data stored within comparand register 420 was found within all memory cells of a CAM word.

In the embodiment of FIG. 6A, the match lines from CAM words 438 are supplied to look-ahead explore decoder 450 for qualification before they are prioritized by look-ahead priority encoder 480. In other words, the explore decoder 450 serves as a qualifier, which sets a range of valid searches between a starting address and an ending address. As noted above, the ending address may be the last logical block address of the memory array, or some other predefined address location. In some cases, the starting address (and possibly, the ending address) may be obtained from logic within or surrounding CAM device 400. For example, the starting address can be based on a "first guess," or based on a more sophisticated narrowing of the address space derived from certain "intelligence." In other cases, the starting (and ending) address may be defined by a user of CAM device 400, and therefore, can be programmed to any value based on his needs. In most cases, the starting (and ending) address may depend on the type of table or database being searched. For example, if the database entries are stored in a particular order (as in the case of ACL tables), the starting address may be selected based on the order or other attributes of the database.

Once a starting address (470) is supplied to CAM device 400, the address decode circuit (460) within the CAM will decode the multi-bit address down to a single wordline. The address decoder uses the single-bit wordline to establish a dividing line between valid and invalid matching entries by supplying enable/disable signals to look-ahead explore decoder 450. The explore decoder 450 uses the enable/disable signals to validate all address locations below (i.e., with higher addresses) and invalidate all address locations above (i.e., with lower addresses) the decoded starting address. The match lines associated with the valid portion of the CAM are fed into the next stage as priority encoder Select signals. Therefore, in the embodiment of FIG. 6A, only the CAM locations which are qualified by the explore decoder 450 will be prioritized when hits occur.

If at least one match is found, priority encoder 480 outputs a positive match indication and the address (or index) of the matching entry. In some cases, more than one match line may be asserted when the parallel search operation detects a matching entry within more than one of the CAM words 438. If more than one match is found, priority encoder 480 determines which of the match lines has top priority and outputs the address of that entry.

In some embodiments, priority encoder 480 may be designed for selecting the highest-priority matching entry by determining which match line (ML0 . . . MLn) is attributable to the lowest numerical CAM address. In FIG. 6A, for example, CAM word n may be at CAM address 0, whereas CAM word 0 may be at the highest CAM address. The lowest CAM address or addresses may have a 32-bit prefix, while the highest CAM address or addresses may have less than 24-bit prefixes. If an incoming data pattern matches every bit within CAM word n, as well as every bit within, for example, CAM word 5, then CAM word n will be selected by priority encoder 480 as the top priority entry, since it resides at the lowest physical address. The matching entry output from priority encoder 480 may then be forwarded to an associated data storage device (e.g., an associated SRAM or DRAM) via output port 490. In some cases, however, the matching entry may be forwarded to match extraction logic 370 before the matching entry is forwarded to an associated data storage device, as described in commonly assigned U.S. patent application Ser. No. 10/866,353.

The range control circuitry shown in FIG. 6A provides a unique method for qualifying valid matching entries (i.e., those falling within a specified range) for participation in the priority encoding process. By specifying a starting address greater than address 0, the range control circuitry prioritizes only those matching entries within the specified range, and effectively ignores all entries outside of the range. In addition to speed improvements, the circuitry shown in FIG. 6A may share logic with the existing wordline decoder for both search and read/write operations. Therefore, the circuitry shown in FIG. 6A provides the advantages of being compact, providing higher performance and fitting well within existing layouts in a tighter space.

Figure 6B:
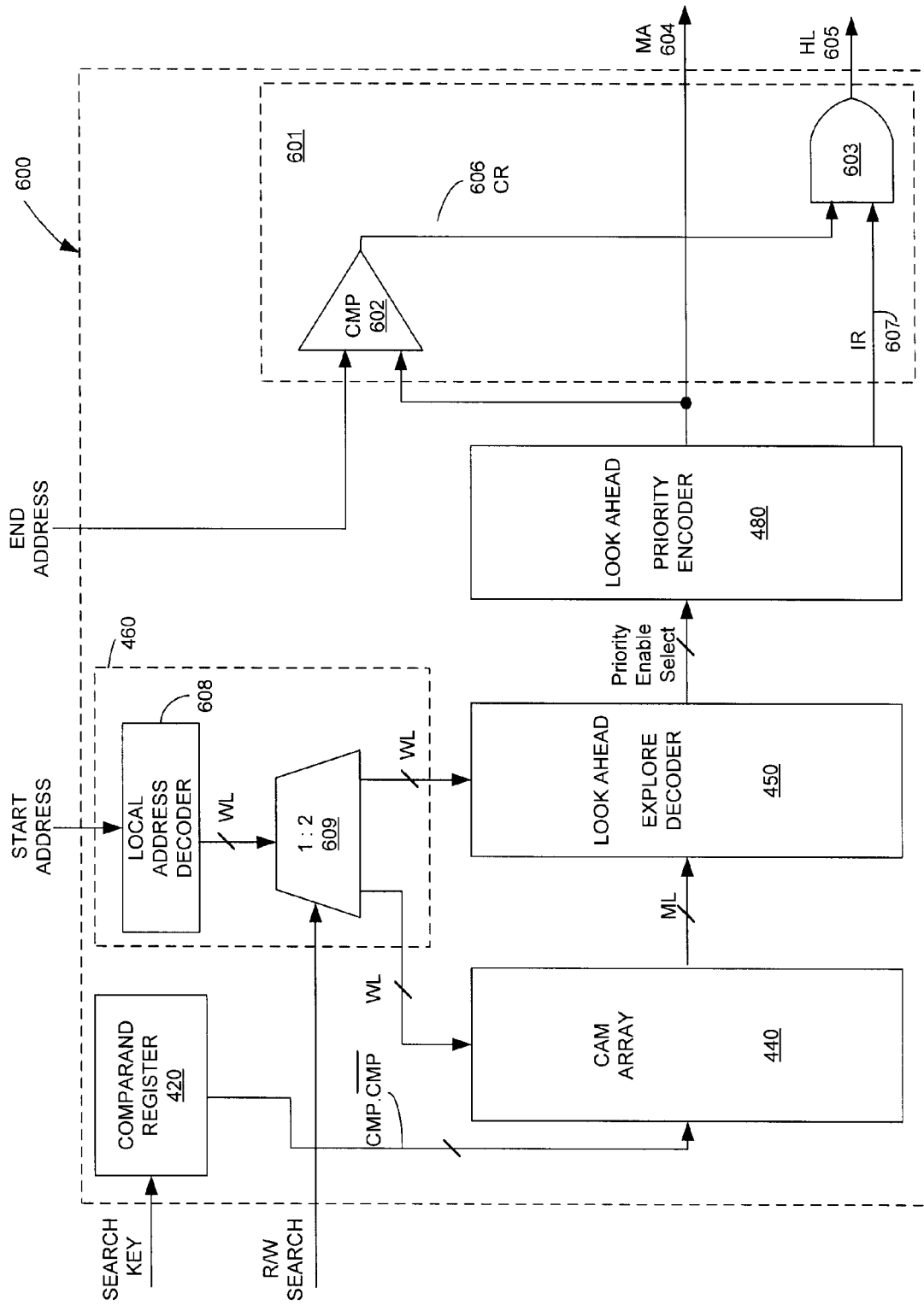
FIG. 6B illustrates an embodiment of the range control circuitry of FIG. 5B.

FIG. 6B illustrates an embodiment of CAM device 600 that utilizes both a start and an end address to further define a selectable search range. In this embodiment, the start address is applied as discussed above to exclude entries stored in lower-numbered addresses than the start address from signaling match indications to priority encoder 480. Priority encoder 480 then outputs a match address, MA 604, and an intermediate result signal, IR 607, which are supplied to end compare 601. End compare 601 includes a comparator circuit 602 and an AND logic gate 603. The comparator circuit 602 receives the end address and the match address 604 and outputs a comparator result signal 606, having a first or second state indicating whether or not the numerical value of the match address 604 is less than or equal to that of the end address. The comparator result signal 606 is ANDed with the intermediate result in AND logic gate 603 to generate a hit or miss signal on the hit line 605.

In the embodiment of FIG. 6B, the start and end addresses are transmitted to CAM 600 via two separate signal paths. However, it is also possible to transmit each address sequentially along a single signal path.

FIG. 6C illustrates circuitry that may be provided within a CAM device to establish pre-defined logical sub-divisions within one or more CAM arrays of the CAM device and thus enable flexible allocation of different sub-divisions (i.e., ranges) to different lookup tables or other data. In the particular embodiment shown, a set of range descriptor circuits $625_1$-$625_n$, each including first and second storage circuits 626, 627 to store corresponding start and end addresses (SA, EA), are provided to enable logical sub-divisions to be pre-defined within the CAM array. By this arrangement, rather than providing a start address/end address in association with each range-limited search instruction, a range selector value may be provided to an instruction decoder 620 (or other control circuit) in conjunction with a range-limited search instruction as shown at 622 and used to select one of the range descriptor circuits 625 to supply start and end addresses that define the logical sub-division to be searched. In the embodiment of FIG. 6C, for example, range selector (or sub-division selector) 624 (RS) is supplied to multiplexer 621 which outputs the start and end addresses within the specified range descriptor circuit 625 as a selected start address 628 (SSA) and a selected end address 630 (SEA). The selected start address 628 may be provided, for example to an address decode circuit as described above in reference to FIG. 6B, and the selected end address 630 may be provided to an end-comparator or, alternatively, to logic circuitry which qualifies match signals as described above. Register write instructions may be issued to the CAM device and decoded by the instruction decoder to enable start and end addresses to be stored within a selected range descriptor circuit 625, thus providing for flexible, programmable range definitions.

Because the range selector 624 may generally be implemented by a value having as few as $\log_2 X$ constituent bits (where X is the number of start/end address descriptor circuits), the range selector may include significantly fewer bits than either the start address or end address, or at least fewer bits than start and end address together and thus reduce the number of signals to be conveyed to the CAM device to effect a range-limited search. It should be noted that while the range descriptors have been described and depicted as pairs of registers selected by a multiplexing circuit, the range descriptors may alternatively be implemented by a storage array that may be addressed by a range selector value 624 to enable start and end addresses to be written therein (e.g., in a programming operation) or read out therefrom (e.g., in a range-limited search operation).

FIG. 6D illustrates a CAM array 440 that is logically partitioned into ranges specified within the range descriptors 625 of FIG. 6C. Note that the ranges may be contiguous as in the ranges defined by range descriptors $625_1$ and $625_2$, discontiguous as in the ranges defined by range descriptors $625_2$ and $625_3$, and may also overlap. Further, while the ranges are shown as falling between start and end addresses of CAM array 440 (i.e., within a device having a continuous set of compare lines or cascaded set of compare lines), address ranges may span all or part of two or more CAM arrays in alternative embodiments that include multiple CAM arrays or multiple CAM blocks. Referring to multiple-block CAM device 638 of FIG. 6E, for example, start address 642 may include a block address and row address that define a CAM block $640_i$ (i.e., within a set of 'm' CAM blocks $6400$-$640m$-$1$, each having a respective CAM array) and starting address therein, and end address 644 may similarly include a block address and row address that defines another CAM block ($640_{i+3}$ in this example) and ending address therein, with the overall search range spanning the region from the starting row within CAM block $640_i$ to the ending row within CAM block $640_{i+3}$ and including one or more intervening CAM blocks ($640_{i+1}$ and $640_{i+2}$ in this example).

The embodiment of FIG. 6B shows two qualification passes (as opposed to the single-pass qualification process illustrated in FIG. 6A). Explore decoder 450 qualifies only those match signals with addresses greater than or equal to the starting address (e.g. by preventing/masking all other match signals) for prioritizing within priority encoder 480. End compare 601 qualifies an output match address 604 if its numerical value is less than or equal to that of the end address. This last qualification pass is not performed by altering the signal to be qualified, as is the case when qualifying match signals, but by altering the hit signal on HL 605.

Using the example shown in FIG. 5C, a first qualification pass performed by explore decoder 450 may permit only the match signals with corresponding addresses 5 and 8 to be prioritized. Priority encoder 480 may then output a match address indicating a match at address 5, along with an intermediate result signal 607 indicating a HIT. However, when comparator 602 determines the numerical value of the match address to be greater than that of the end address (i.e. MA=5>EA=4), compare result 606 will indicate a MISS which, when combined with the HIT from intermediate result 607 via AND logic, will generate a MISS on the hit line 605.

It should be noted that the end compare circuit 601 of FIG. 6B can be implemented outside of CAM 600. For example, NSE 350 of FIG. 3 may comprise of CAM devices according to the embodiment of FIG. 6A, and the end compare circuitry embodied in FIG. 6B may be included in the LCPU 300. As such, the LCPU may provide NSE 350 with a search key and a starting address, and NSE 350 may return a match result along with a signal indicating a HIT or a MISS, which will then be applied to the end compare circuitry within the LCPU 300 to resolve whether or not the returned match address actually lies within a desired search range.

It should be noted that the end compare logic of end compare 601 shown FIG. 6B can be implemented to qualify the match signals before they are input into the priority encoder. Thus, only the match signals with addresses within the range specified by both the start and end addresses will be prioritized by the priority encoder. Given the method employed by the explore decoder for qualifying only the match signals with addresses greater than or equal to a start address, one skilled in the art can easily see how an end compare circuit can be implemented, in a similar fashion, to qualify only the match signals with addresses less than or equal to an end address.

FIG. 6B also shows an embodiment of address decode 460, implemented using a local address decoder 608 and a demultiplexer 609. The demultiplexer 609 acts as a switch, to activate either the world lines (WL) in the CAM array 440 or the word lines in the explore decoder 450.

Figure 7:
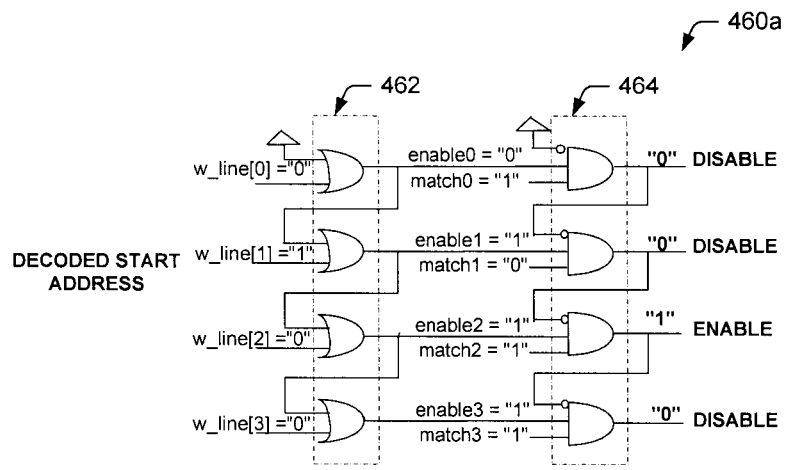
FIG. 7 is a circuit diagram illustrating a portion of the local address decoder shown in FIGS. 4B-6A, in accordance with one embodiment of the invention.
Figure 8:
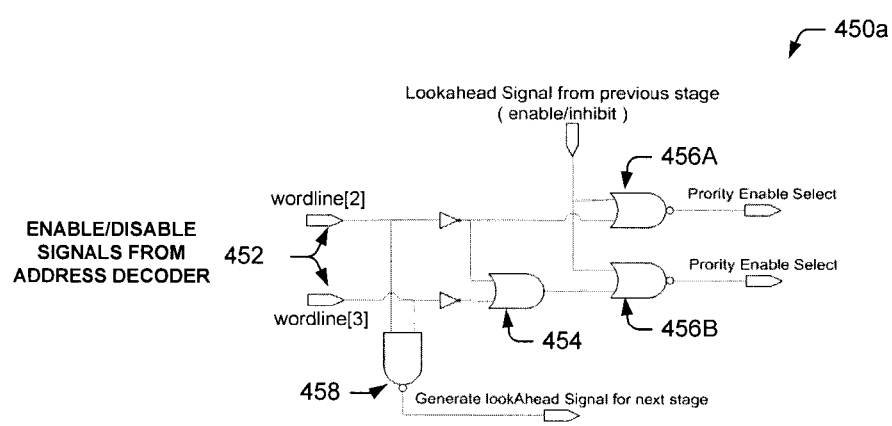
FIG. 8 is a circuit diagram illustrating a portion of the look-ahead explore decoder shown in FIGS. 4B-6A, in accordance with one embodiment of the invention.
Figure 9:
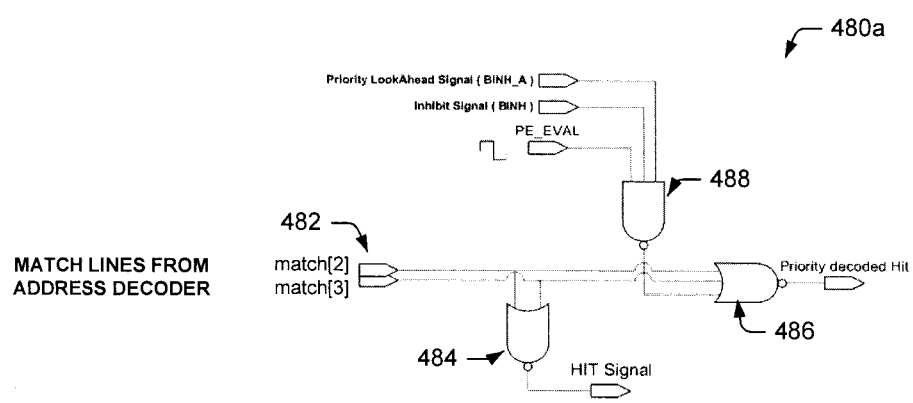
FIG. 9 is a circuit diagram illustrating a portion of the look-ahead priority encoder shown in FIGS. 4B-6A, in accordance with one embodiment of the invention.

FIGS. 7-9 are circuit diagrams illustrating various building blocks that may be used to construct address decode 460, look-ahead explore decoder 450 and look-ahead priority encoder 480. As described in more detail below, address decode 460 may enable only one wordline based on the starting address supplied thereto. Next, look-ahead explore decoder 450 may then take the enabled wordline (e.g., wordline[1]) and enable all matchlines, including HITS and MISSES, which are greater than or equal to the starting address (i.e., match1, match2, match3). Look-ahead priority encoder 480 may then prioritize only the enabled matchlines (i.e., match1, match2 and match3). Once a HIT matchline (e.g., match2) is found with the lowest physical address, priority encoder 480 may disable all other HITS (e.g., match3), which has a higher physical address than match2).

FIG. 7 is a circuit diagram illustrating a portion of the address decode 460 shown in FIGS. 4B-6A, according to one embodiment of the invention. For example, the enabling portion (460a) shown in FIG. 7 may be arranged after a decoding portion (not shown) of address decode 460 for receiving the starting address after it has been decoded into a single wordline. In the example of FIG. 7, enabling portion 460a receives a logic high value (e.g., a logic 1) on word line[1] and logic low values (e.g., logic 0's) on all other wordlines, indicating that address decode 460 has received a starting address of 1.

The enabling portion of address decode 460 may be implemented in logic, only one example of which is shown in FIG. 7. Other implementations are possible and within the scope of the invention.

As shown in FIG. 7, enabling portion 460a may include a plurality of OR gates 462, each coupled for receiving a corresponding logic value from one of the decoded wordlines (e.g., wordlines[0 ... 3]). In addition to the logic values, OR gates 462 may be cascaded so that the logical result of a previous stage is input to the following stage as an intermediate enable/disable signal (e.g., enable[0 ... 3]). At this point, the intermediate enable/disable signals may distinguish which wordlines are within the specified range (e.g., wordlines[1 ... 3]), and which are not (e.g., wordline[0]). The results from OR gates 462 are supplied to a plurality of AND gates 464 along with a match line result (e.g., match[0 ... 3]) from CAM words 438. Like OR gates 462, AND gates 464 are also cascaded. In this case, however, the logical result of a previous AND stage is inverted before it is input to a following AND stage.

The enabling portion of address decode 460 enables only one wordline (e.g., wordline[1] in FIG. 7) based on the results of the decoded starting address. For example, matching entries may be found on wordlines [0], [2] and [3], as shown in FIG. 7. However, only the matching entry (match[2] found on wordline[2]) is enabled (e.g., set to logic 1), since match[0] falls outside of the specified range and match[3] has a higher physical address than match[2]. Once determined, the enable (1) and disable (0) signals are supplied to look-ahead explore decoder 450 for qualification.

FIG. 8 is a circuit diagram illustrating a portion of the look-ahead explore decoder 450 shown in FIGS. 5A-6A, according to one embodiment of the invention. In particular, the portion (450a) shown in FIG. 8 may be used for qualifying one or more memory blocks based on the enable/disable signals received from the enabling portion of address decode 460. For example, assume that a memory device is split into blocks A, B and C, with each block comprising ten words (e.g., A[1 ... 10], B[11 ... 20], C[21 ... 30]). If wordline[5] were enabled by address decode 460, the explore decoder 450 would qualify memory blocks A, B and C for prioritization. However, only memory blocks B and C would be qualified if wordline[11] were, instead, enabled by address decode 460.

Like FIG. 7, the explore decoder 450 may be implemented in logic, only one example of which is shown in FIG. 8. Other implementations are possible and within the scope of the invention. It is also noted that the portion (450a) of the look-ahead explore decoder 450 shown in FIG. 8 is simply one building block out of several blocks that may be used to construct explore decoder 450. In most cases, the portion shown in FIG. 8 may be duplicated and cascaded, so that the "look-ahead" signal generated by a previous stage is supplied to the following stage. The implementation and operation of the look-ahead explore decoder 450 will now be described in more detail.

As shown in FIG. 8, explore decoder portion 450a may receive the appropriate enable/disable signals from address decode 460 at input pins 452. Once received, the signals are inverted and supplied to OR gate 454 and to one of the NOR gates (456A). Another NOR gate (456B) receives the logical result generated by OR gate 454. For example, OR gate 454 may supply a logic high result to NOR gate 456B, if at least one wordline is enabled by the address decoding logic (e.g., if wordline[2] and/or wordline[3] is set to a logic 1). If the "look-ahead" signal from a previous stage is inhibited (e.g., set to a logic 0), explore decoder portion 450a may qualify the appropriate memory block by generating a logic high "priority enable select" signal.

The enable/disable signals from the enabling portion of address decode 460 may also be supplied to NAND gate 458 for generating a "look-ahead" signal for the next stage (e.g., explore decoder portion 450b, not shown). If a memory block associated with either wordline[2] or wordline[3] is qualified by a logic high "priority enable select" signal, the "look-ahead" signal generated by explore decoder portion 450a will enable all subsequent memory blocks, which are now known to lie within the specified range. The "priority enable select" signals generated by look-ahead explore decoder 450 may then be supplied to look-ahead priority encoder 480.

FIG. 9 is a circuit diagram illustrating a portion of the look-ahead priority encoder 480 shown in FIGS. 4B-6A, according to one embodiment of the invention. In particular, the portion (480a) shown in FIG. 8 may be used for selecting the matching entry having the lowest physical address from the memory blocks qualified by explore decoder portion 450a. For example, assume that a starting address of 2 qualified memory blocks A[1 ... 10], B[11 ... 20] and C[21 ... 30] for prioritization. If matching entries are detected on match lines 3, 11 and 22, priority encoder portion 480a would select match line 3 as the HIT signal having the highest priority.

Like FIGS. 7 and 8, the Priority Encoding circuitry may be implemented in logic, only one example of which is shown in FIG. 9. Other implementations are possible and within the scope of the invention. It is also noted that priority encoder portion 480a shown in FIG. 9 is simply one building block out of several blocks that may be used to construct priority encoder 480. In most cases, the portion (480a) shown in FIG. 9 may be cascaded, so that any HIT signals generated in previous stages will be supplied to the following stage. The implementation and operation of the look-ahead priority encoder 480 will now be described.

As shown in FIG. 9, priority encoder portion 480a may receive the match line results from address decode 460 at input pins 482. The match line results (e.g., match[2], match [3]) are supplied to NOR gate 484, where a HIT signal is generated if a matching entry is found on either (inverted) match line. If a matching entry is found, the HIT signals generated by NOR gate 484 are supplied to the Inhibit Signal input of the next priority encoding stage (e.g., priority encoding portion 480b, not shown) to inhibit any HITs that may occur in subsequent stages.

The match line results are also supplied to NOR gate 486 for selecting the matching entry with the highest priority. In addition to the match line results, NOR gate 486 may receive an Inhibit Signal input from a previous stage and a Priority look-ahead Signal, which may be tied to a logic high potential. If the Inhibit Signal from the previous stage is activated (meaning that a matching entry has already been found with a lower address), any matching entries supplied to priority encoding portion 480a will be ignored. Otherwise, priority encoding portion 480a may generate a logic high "priority decoded HIT" signal if a HIT is detected on one of the match lines (match[2] or match[3]). The "priority decoded HIT" signal may then be supplied to an associated memory device for obtaining the information specified by the CAM entry with the highest priority.

Figure 6F:
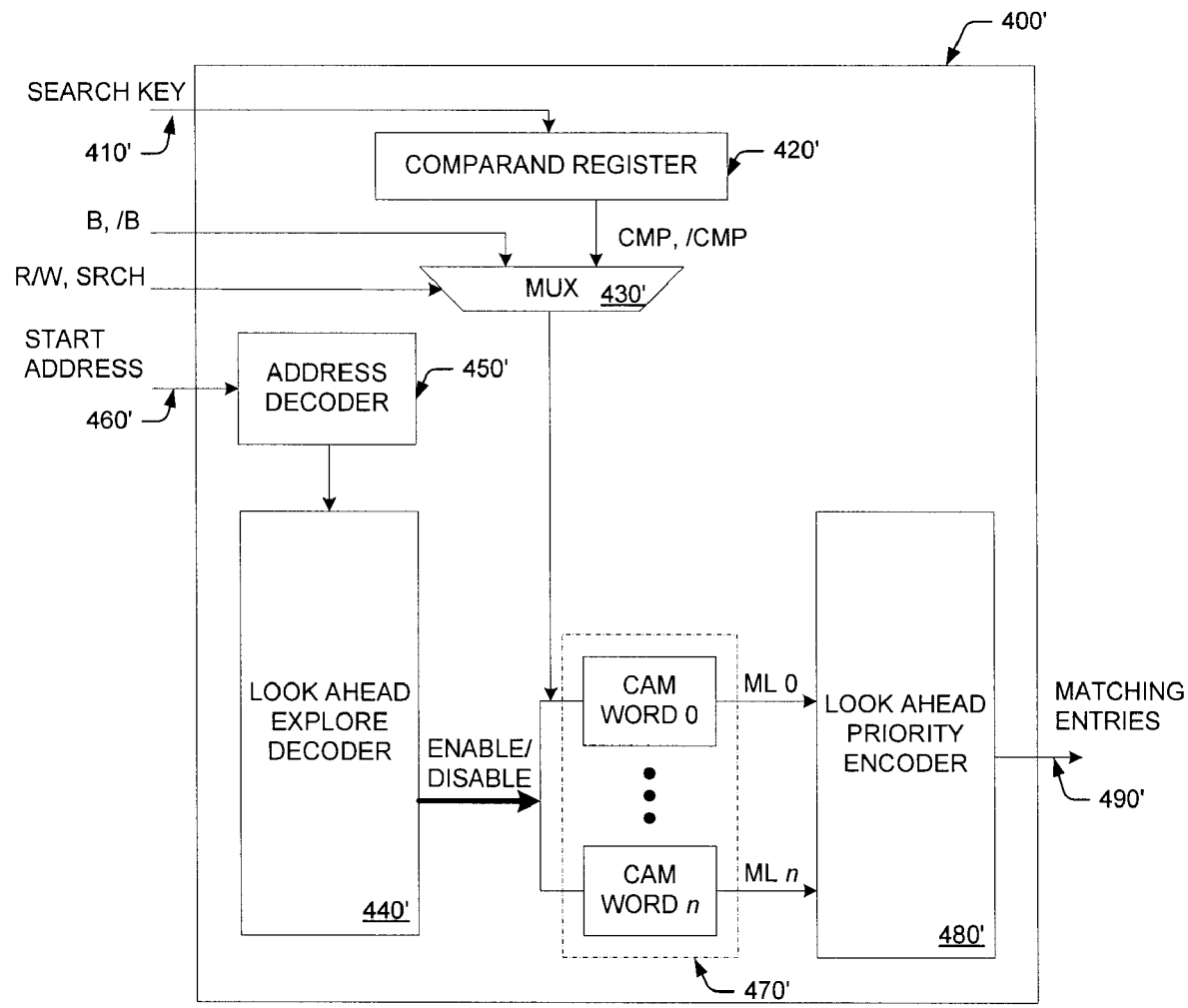
FIG. 6F is a functional block diagram illustrating an exemplary manner in which the range control circuitry of FIG. 4B may be used for searching only a portion of the entries within a CAM device.

FIG. 6F illustrates an alternative embodiment of CAM device 400'. Though similar to the embodiment shown in FIG. 6A, CAM device 400' differs by arranging the CAM content 470' between the look-ahead explore decoder 440' and look-ahead priority encoder 480'. In this embodiment, only the CAM locations which are qualified by the explore decoder 440' will be searched. Therefore, the embodiment shown in FIG. 6B reduces power consumption during search operations by using look-ahead explore decoder 440' to disable the CAM entries, which are located before the starting address, from participating in searches.

For example, local address decoder 450' is coupled to explore decoder 440' and configured for receiving a starting address 460' from surrounding logic or a user of CAM device 400'. Instead of qualifying a set of match lines within a specified range for prioritization, the explore decoder 440' decides where to begin the search (i.e., which wordline) based on a decoded version of the starting address. Only the CAM words 438' with addresses greater than or equal to the starting address are searched (by way of the enable/disable signals sent to the CAM words). After searching, the enabled match line signals (i.e., those within the specified range) are supplied to priority encoder 480' as "priority enable select" signals. The priority encoder may detect a HIT signal from only those match lines which are "enabled" by the explore decoder 440'.

Figure 4C:
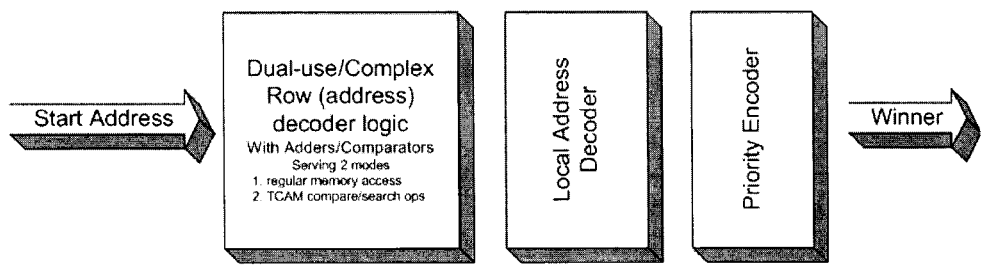
FIG. 4C is a simplified block diagram illustrating alternative components of the range control circuitry, in accordance with another embodiment of the invention.

FIG. 4C is a simplified block diagram illustrating another manner in which Range control circuitry may be incorporated within a memory device, such as TCAM device 400. In FIG. 4C, the Range control circuitry is included within a dual-purpose address decoder serving two modes: i) regular memory access, and ii) TCAM compare/search operations. During search operations, the dual-purpose address decoder implements the look-ahead explore decoder by allowing one or more TCAM rows to participate in the search. The dual-purpose address decoder may be cascaded within an existing priority encoder with the addition of glue logic (e.g., combinatorial and sequential logic). However, adding glue logic increases die area when compared with traditional "pitched" address decoders. Speed is also impacted in the embodiment of FIG. 4C, not only in the compare/search mode, but also in the read/write mode when accessing memory. Therefore, although a viable option, the embodiment shown in FIG. 4C provides a higher gate count, larger die area and lower performance than the embodiment shown in FIG. 4B. In addition, the "look-ahead" feature cannot be implemented in the embodiment of FIG. 4C, since the explore decoder is merged with the regular read/write address decoder.

It should be noted that the various integrated circuits, dice and packages disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

Although the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
    a CAM array to store data values in entries having respective addresses and to compare the data values with a search key;
    an interface to receive a first address and a second address that define a range of the addresses;
    range-control circuitry to generate a hit signal having either a first state or a second state according to whether any of the entries having addresses within the range of addresses match the search key;
    wherein the range-control circuitry includes:
        a decoder circuit to receive the first address and a plurality of match signals, and to output a plurality of enable signals each having either a first state or a second state according to the state of each corresponding match signal and whether their respective addresses are greater than or equal to the first address; and
        an encoder circuit to receive the plurality of enable signals and to output a match address and an intermediate result signal.

2. The CAM device of claim 1 wherein the interface comprises a first address input and a second address input to enable the first and second addresses to be received concurrently.

3. The CAM device of claim 1 wherein the interface comprises a time-multiplexed input to receive the first and second addresses sequentially.

4. The CAM device of claim 1 wherein the second address is greater in numerical value than the first address.

5. The CAM device of claim 4 wherein the second address is lower in numerical value than a last address of the CAM array.

6. The CAM device of claim 4 wherein the CAM array comprises the plurality of match signals each corresponding to a row of CAM cells, each match signal having either a first state or a second state according to whether contents within the respective row matches the search key.

7. The CAM device of claim 1 further comprising an end-compare circuit, wherein the end-compare circuitry comprises:
    a comparator to receive the second address and the match address, and to output a comparator result signal having either the first state or the second state according to whether the match address is greater than or equal to the second address; and
    a logic gate to receive the comparator result signal and the intermediate result signal, and to output the hit signal.

8. A content addressable memory (CAM) device comprising:
    a CAM array to store data values in entries having respective addresses and to compare the data values with a search key;
    an interface to receive a first address and a second address that define a range of the addresses;
    range-control circuitry to generate a hit signal having either a first state or a second state according to whether any of the entries having addresses within the range of address match the search key;
    wherein the range-control circuitry includes:
        a decoder circuit to receive the first address, the second address, and the plurality of match signals, and to output a plurality of enable signals each having either a first state or a second state according to the state of each of corresponding match signal and whether the numerical values of their respective addresses are greater than or equal to that of the first address and less than or equal to that of the second address; and
    an encoder circuit to receive the plurality of enable signals and to output a match address and the hit signal.

9. Computer-readable media having information embodied therein that includes a description of an integrated circuit device, the information including descriptions of:
    a CAM array to store data values in entries having respective addresses and to compare the data values with a search key;
    an interface to receive a first address and a second address that define a range of the addresses;
    range-control circuitry to generate a hit signal having either a first state or a second state according to whether any of the entries having addresses within the range of addresses match the search key; and
    wherein the range-control circuitry includes:
        a decoder circuit to receive the first address and the plurality of match signals, and to output a plurality of enable signals each having either a first state or a second state according to the state of each corresponding match signal and whether their respective addresses are greater than or equal to the first address; and
        an encoder circuit to receive the plurality of enable signals and to output a match address and an intermediate result signal.

10. Computer-readable media having information embodied therein that includes a description of an integrated circuit device, the information including descriptions of:
    a CAM array to store data values in entries having respective addresses and to compare the data values with a search key;

an interface to receive a first address and a second address that define a range of the addresses;

range-control circuitry to generate a hit signal having either a first state or a second state according to whether any of the entries having addresses within the range of addresses match the search key;

wherein the range-control circuitry includes:

a decoder circuit to receive the first address, the second address, and the plurality of match signals, and to output a plurality of enable signals each having either a first state or a second state according to the state of each of corresponding match signal and whether the numerical values of their respective addresses are greater than or equal to that of the first address and less than or equal to that of the second address; and an encoder circuit to receive the plurality of enable signals and to output a match address and the hit signal.

* * * * *

UNITED STATES PATENT AND TRADEMARK OFFICE
CERTIFICATE OF CORRECTION

PATENT NO. : 7,581,059 B2  
APPLICATION NO. : 11/460615  
DATED : August 25, 2009  
INVENTOR(S) : Gupta et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 582 days.

Signed and Sealed this

Fourteenth Day of September, 2010

David J. Kappos  
*Director of the United States Patent and Trademark Office*